United States Patent
Du et al.

(10) Patent No.: US 9,000,435 B1
(45) Date of Patent: Apr. 7, 2015

(54) DISPLAY DEVICE AND TESTING LINE REPAIRING METHOD THEREOF

(71) Applicant: Shenzhen China Star Optoelectronics Technology Co., Ltd., Shenzhen (CN)

(72) Inventors: Peng Du, Shenzhen (CN); Minghung Shih, Shenzhen (CN)

(73) Assignee: Shenzhen China Star Optoelectronics Technology Co Ltd, Shenzhen (CN)

(*) Notice: Subject to any disclaimer, the term of this patent is extended or adjusted under 35 U.S.C. 154(b) by 0 days.

(21) Appl. No.: 14/234,419

(22) PCT Filed: Dec. 30, 2013

(86) PCT No.: PCT/CN2013/090821
§ 371 (c)(1),
(2) Date: Jan. 23, 2014

(51) Int. Cl.
| | |
|---|---|
| *H01L 27/00* | (2006.01) |
| *H01L 27/12* | (2006.01) |
| *H01L 21/66* | (2006.01) |
| *H01L 27/105* | (2006.01) |
| *H01L 23/48* | (2006.01) |
| *H01L 23/00* | (2006.01) |
| *H01L 27/32* | (2006.01) |

(52) U.S. Cl.
CPC .......... *H01L 27/1244* (2013.01); *H01L 22/22* (2013.01); *H01L 22/32* (2013.01); *H01L 27/105* (2013.01); *H01L 23/481* (2013.01); *H01L 24/48* (2013.01); *H01L 27/3223* (2013.01); *H01L 24/83* (2013.01); *H01L 2251/568* (2013.01); *H01L 2924/10* (2013.01); *H01L 2224/83191* (2013.01); *H01L 2224/48227* (2013.01); *H01L 2224/73265* (2013.01)

(58) Field of Classification Search
CPC .......... H01L 2224/48227; H01L 2224/73265; H01L 27/105; H01L 23/481; H01L 24/48; H01L 27/3223; H01L 24/83; H01L 2224/83191; H01L 2251/568; H01L 2924/10
See application file for complete search history.

(56) References Cited

U.S. PATENT DOCUMENTS

| 8,674,738 B2* | 3/2014 | Nishijima ...................... 327/208 |
| 2005/0180083 A1* | 8/2005 | Takahara et al. ............... 361/152 |
| 2007/0080905 A1* | 4/2007 | Takahara ......................... 345/76 |
| 2011/0108888 A1* | 5/2011 | Or-Bach et al. ............... 257/204 |
| 2011/0130981 A1* | 6/2011 | Chaji et al. ....................... 702/58 |
| 2012/0129301 A1* | 5/2012 | Or-Bach et al. ............... 438/129 |

* cited by examiner

*Primary Examiner* — Ngan Ngo
(74) *Attorney, Agent, or Firm* — Mark M Friedman (57) ABSTRACT

A display device and a testing line repairing method thereof is provided herein and the method comprises steps of: cutting off a connection between a first input end of a first thin film transistor (TFT), a first output end and a testing signal input line; and connecting a first dummy line and a testing signal output line by a laser welding method. The width-to-length ration in the display device of the present disclosure won't be varied and an abnormal display in the light-on testing won't happen.

20 Claims, 4 Drawing Sheets

DISPLAY DEVICE AND TESTING LINE REPAIRING METHOD THEREOF

FIELD OF THE DISCLOSURE

The present invention relates to the field of flat panel display technology, and more particularly relates to a display device and testing line repairing method thereof.

BACKGROUND OF THE DISCLOSURE

Figure 1:
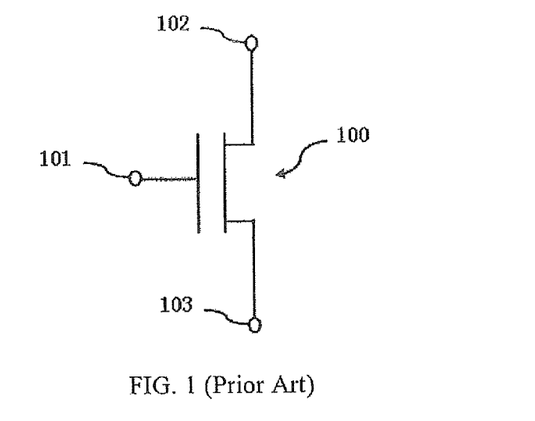
FIG. 1 is a view of a conventional technical method to test the display panel.

Generally, the conventional display panel testing technique is illustrated in the following description. As shown in FIG. 1, a thin film transistor (TFT) 100 is implemented as a switch. A drain 102 of the TFT 100 is connected with a testing signal generator, a source 103 of the TFT 100 is connected with a gate line/data line within the display panel, and a gate 101 of the TFT 100 is connected with a controlling signal generator.

During the testing procedure, the controlling signal generator outputs a high voltage level signal to the gate 101 to turn on the switch 100, and the source 103 and the drain 102 are conducted. After the testing procedure is done, the controlling signal generator outputs a low voltage level signal to the gate 101 to turn off the switch 100 and the connection between the source 103 and the drain 102 is cut off.

Figure 2:
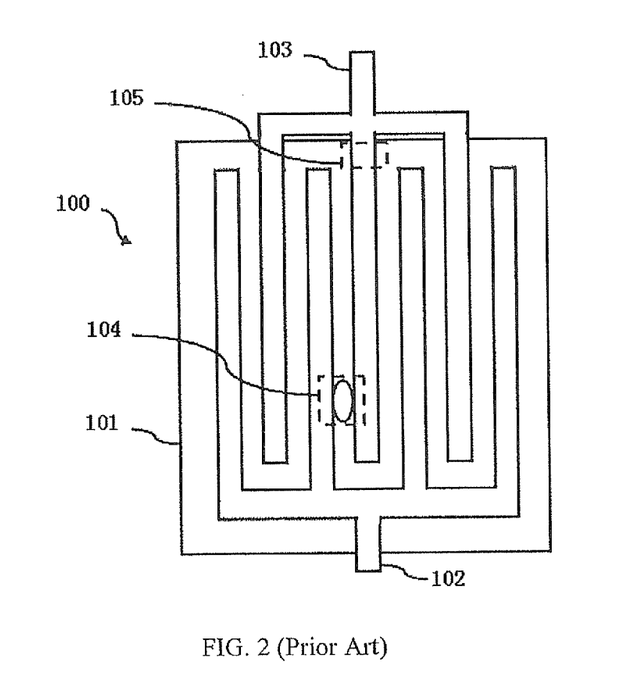
FIG. 2 is a view of a repairing method when a short circuit has occurred in a thin film transistor in FIG. 1.

During the manufacture process, since the particle existed, a short circuit would have occurred between the source 103 and the drain 102 in the TFT 100. For example, as shown in FIG. 2, the short circuit has occurred in the area 104. As in the aforementioned technical condition, the conventional repairing method is to cut in a cut-off position 105 by laser. However, practically, there are couple problems in the conventional techniques. For example:

1. If the short circuit is not going to be repaired, or the conventional method is used to repair the short circuit but the width-to-length ratio of the TFT 100 is varied, the light-on test for the display panel will show the abnormal display because of the difference of the line resistance or a line defect has occurred to cause error detection so as to cause an unnecessary waste and loss.

2. When a curing procedure is implemented in the PSVA type display panel and the short circuit has occurred between the source 103 and the drain 102 in the TFT 100, there is permanent malfunction of the line in the display panel if it is not repaired or the conventional method is implemented to repair.

Therefore, it is necessary to provide a novel technical solution to solve the aforementioned problems.

SUMMARY OF THE DISCLOSURE

One object of the present invention is to provide a display device and a testing line repairing method thereof, and the width-to-length ration won't be varied so as to avoid the abnormal display during the light-on testing.

In order to solve the technical problem described above, one technical solution provided in the present invention is as follows.

A display device comprises a display panel comprising a first thin film transistor (TFT) array comprising at least one first TFT; a second TFT array comprising at least one second TFT; and at least one first dummy line, wherein the first TFT is adjacent to the second TFT and the second TFT is connected with a testing signal input line and the first dummy line; when a short circuit has occurred in the first TFT, a first connection between a first input end of the first TFT and the first dummy line is cut off by a laser cutting method, and a second connection between the first input end of the first TFT and a testing signal output line is cut off by the laser cutting method, the first dummy line is connected with the testing signal output line by a laser welding method; and the display panel further comprising a controlling signal line array comprising at least one controlling signal line; and a first controlling end of the first TFT is connected with a second controlling end of the second TFT and the controlling signal line, and when the short circuit has occurred in the first TFT, a controlling signal is received in the second controlling end from the controlling signal line; the first output end is a drain or a source of the first TFT when the first input end is the source or the drain of the first TFT.

In the aforementioned display device, the second controlling end is implemented to turn on or off a switch corresponding to the second TFT in accordance with the controlling signal.

In the aforementioned display device, a second input end of the second TFT is connected with the testing signal input line and a second output end of the second TFT is connected with the first dummy line.

In the aforementioned display device, the first dummy line comprises a first section, a second section and a third section; the second section is disposed between the first section and the third section, and the second section is connected with the second output end. When the short circuit has occurred in the first TFT, the second section is connected with the testing signal output line by the laser welding method, a third connection between the first section and the third section is cut off by the laser cutting method, and a fourth connection between the third section and the second section is cut off by the laser cutting method.

In the aforementioned display device, the first dummy line includes a first end and a second end and the first end is connected with the second output end and the second end is disposed in another side of the testing signal output line opposite the first end. When the short circuit has occurred in the first TFT, the first dummy line is connected with the testing signal output line by the laser welding method.

In the aforementioned display device, the display device further comprises at least one second dummy line including a fourth section, a fifth section and a sixth section; the fifth section is disposed between the fourth section and the sixth section, and the fifth section is connected with the second input end. When the short circuit has occurred in the first TFT, the fifth section is connected with the testing signal input line by the laser welding method, a fifth connection between the fourth section and the fifth section is cut off by the laser cutting method, and a sixth connection between the sixth section and the fifth section is cut off by the laser cutting method.

A display device comprises a display panel comprising a first thin film transistor (TFT) array comprising at least one first TFT; a second TFT array comprising at least one second TFT; and at least one first dummy line, wherein the first TFT is adjacent to the second TFT and the second TFT is connected with a testing signal input line and the first dummy line. When a short circuit has occurred in the first TFT, a first connection between a first input end of the first TFT and the first dummy line is cut off by a laser cutting method, and a second connection between the first input end of the first TFT and a testing signal output line is cut off by the laser cutting method, the first dummy line is connected with the testing signal output line by a laser welding method.

In the aforementioned display device, the display panel further comprises a controlling signal line array comprising at least one controlling signal line; and a first controlling end of the first TFT is connected with a second controlling end of the second TFT and the controlling signal line, and when the short circuit has occurred in the first TFT, a controlling signal is received in the second controlling end from the controlling signal line.

In the aforementioned display device, the second controlling end is implemented to turn on or off a switch corresponding to the second TFT in accordance with the controlling signal.

In the aforementioned display device, a second input end of the second TFT is connected with the testing signal input line and a second output end of the second TFT is connected with the first dummy line.

In the aforementioned display device, the first dummy line comprises a first section, a second section and a third section; and the second section is disposed between the first section and the third section and the second section is connected with the second output end. When the short circuit has occurred in the first TFT, the second section is connected with the testing signal output line by the laser welding method, a third connection between the first section and the third section is cut off by the laser cutting method, and a fourth connection between the third section and the second section is cut off by the laser cutting method.

In the aforementioned display device, the first dummy line includes a first end and a second end and the first end is connected with the second output end and the second end is disposed in another side of the testing signal output line opposite the first end. When the short circuit has occurred in the first TFT, the first dummy line is connected with the testing signal output line by the laser welding method.

In the aforementioned display device, the display device further comprises at least one second dummy line including a fourth section, a fifth section and a sixth section; the fifth section is disposed between the fourth section and the sixth section, and the fifth section is connected with the second input end. When the short circuit has occurred in the first TFT, the fifth section is connected with the testing signal input line by the laser welding method, a fifth connection between the fourth section and the fifth section is cut off by the laser cutting method, and a sixth connection between the sixth section and the fifth section is cut off by the laser cutting method.

In the aforementioned display device, the first output end is a drain or a source of the first TFT when the first input end is the source or the drain of the first TFT.

A testing line repairing method of the display device comprises: A. cutting the first connection and the second connection by the laser cutting method, and the first connection is between the first input end of the first TFT and the testing signal input line, and the second connection is between the first output end of the first TFT and the testing signal output line; and B. connecting the first dummy line with the testing signal output line by the laser welding method in the display device, wherein the second input end of the second TFT in the display device is connected with the testing signal input line, and the second output end of the second TFT is connected with the first dummy line.

In the aforementioned display device, step B comprises: B1. connecting the second section of the first dummy line with the testing signal output line by the laser welding method; and the method further comprises: C. cutting off a third connection and a fourth connection by the laser cutting method, wherein the third connection is between the first section and the second section of the first dummy line and the fourth connection is between the third section and the second section of the first dummy line; wherein the second output end is connected with the second section and the second section is disposed between the first section and the third section.

In the aforementioned display device, the method further comprises: D. connecting the first dummy line with the testing signal output line by the laser welding method; wherein the first dummy line includes a first end and a second end, and the first end is connected with the second output end and the second end is disposed at another side of the testing signal output line opposite the first end.

In the aforementioned display device, the method further comprises: E. cutting off a fifth connection and a sixth connection by the laser cutting method, and the fifth connection is between a fourth section and a fifth section of a second dummy line and the sixth connection is between a sixth section and the fifth section of the second dummy line in the display device; F. connecting the fifth section with the testing signal input line by the laser welding method; wherein the fifth section is between the fourth section and the sixth section and the fifth section is connected with the second input end.

In the aforementioned display device, the first output end is a drain or a source of the first TFT when the first input end is the source or the drain of the first TFT.

In the aforementioned display device, the method further comprises: G. the second controlling end of the second TFT receives a controlling signal from a controlling signal line in the display device to turn on or off a switch corresponding to the second TFT.

The advantage of the present invention is that the width-to-length ratio of the display device will not be changed and the abnormal display won't happen in the light-on testing and error detection won't happen. The malfunction of the lines in the display panel during the curing process is reduced and the yield of the display panel is increased.

DETAILED DESCRIPTION OF THE PREFERRED EMBODIMENTS

The above-mentioned description of the present invention can be best understood by referring to the following detailed description of the preferred embodiments and the accompanying drawings.

In drawings, the components with similar structure are represented by the same sign.

Figure 3A:
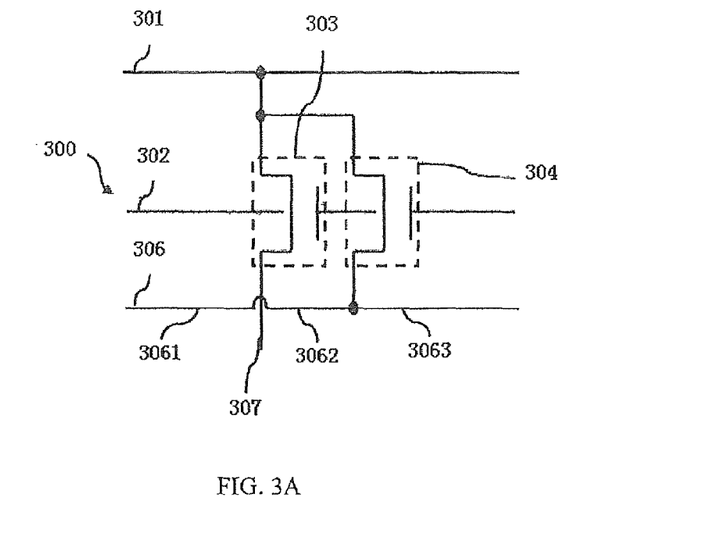
FIG. 3A is a view of the display device in a first embodiment of the present invention.
Figure 3B:
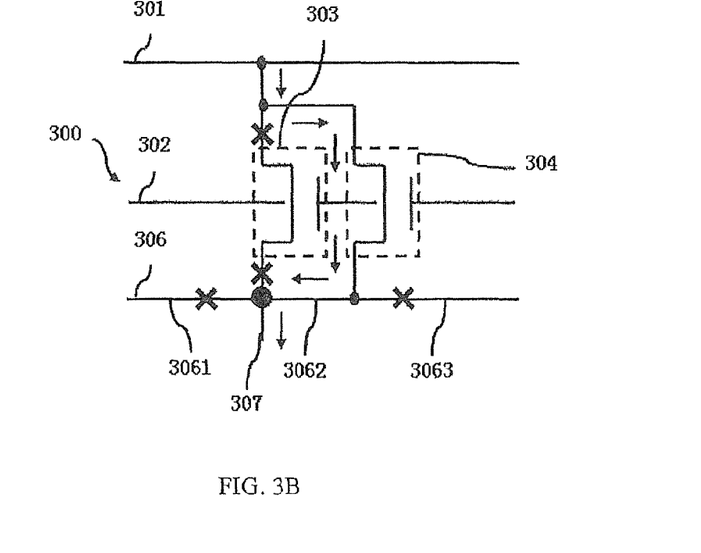
FIG. 3B is a view of the repairing method for the display device in FIG. 3A.

Referring FIG. 3A and FIG. 3B, FIG. 3A is a view of the display device in a first embodiment of the present invention. FIG. 3B is a view of the repairing method for the display device in FIG. 3A. The dots "●" in FIG. 3B are the laser welding positions and the crosses "X" in FIG. 3B are the laser cutting positions.

The display device in the present embodiment includes a display panel 300. The display panel 300 includes a first thin film transistor (TFT) array, a second TFT array, and at least one first dummy line 306. The first TFT array includes at least one TFT 303 and the second TFT array includes at least one TFT 304. The second TFT 304 is a backup TFT for the first TFT 303 and the second TFT 304 is configured for repairing the display device/the display panel 300 when a short circuit has occurred in the first TFT 303.

The first TFT 303 is adjacent to the second TFT 304 and the second TFT 304 is connected with the testing signal input line 301 and the first dummy line 306.

When the short circuit has occurred in the first TFT 303, a first connection between a first input end of the first TFT 303 and the testing signal input line 301 is cut off by a laser cutting method. A second connection between a first output end of the first TFT 303 and a testing signal output line 307 is cut off by a laser cutting method. The first dummy line 306 is connected with the testing signal output line 307 by the laser welding method. The first input end is a source/drain of the first TFT 303 and, correspondingly, the first output end is the drain/source of the first TFT 303.

The display panel 300 further includes a controlling signal line array and the controlling signal line array includes at least one controlling signal line 302.

A first controlling end of the first TFT 303 and a second controlling end of the second TFT 304 are connected with the controlling signal line 302. If the short circuit has occurred in the first TFT 303, the second controlling end is configured for receiving the controlling signal from the controlling signal line 302 and turns on or off the switch corresponding to TFT 304 in accordance with the controlling signal. A second input end of the second TFT 304 is connected with the testing signal input line 301, and a second output end of the second TFT 304 is connected with the first dummy line 306.

In the present embodiment, the first dummy line 306 includes a first section 3061, a second section 3062, and a third section 3063. The second section 3062 is disposed between the first section 3061 and the third section 3063. And the second section 3062 is connected with the second output end.

When the short circuit has occurred in the first TFT 303, the second section 3062 is connected with the testing signal output line 307 by the laser welding method. The third connection between the first section 3061 and the second section 3062 is cut off by the laser cutting method. The fourth connection between the third section 3063 and the second section 3062 is cut off by the laser cutting method.

In the present embodiment, the repairing method of the display device is to cut off the connection (the first connection and the second connection) between the damaged TFT (such as the first TFT 303 with the short circuit) and the testing signal line 301 and the data line/gate line (corresponding to the testing signal output line 307). The testing signal in the testing signal line 301 can transmit the testing signal to the display zone within the display panel from the backup TFT (the second TFT 304). Subsequently, the first dummy is cut off. After repairing, the transmitting path of the testing signal is shown as the arrows in FIG. 3B.

The repairing method of the display device in the present embodiment is required to process four times for laser cutting and one time for laser welding.

Figure 4A:
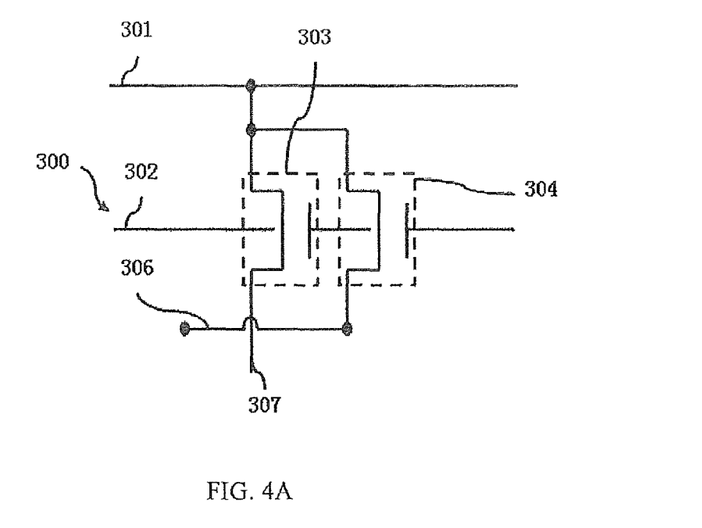
FIG. 4A is a view of the display device in a second embodiment of the present invention.
Figure 4B:
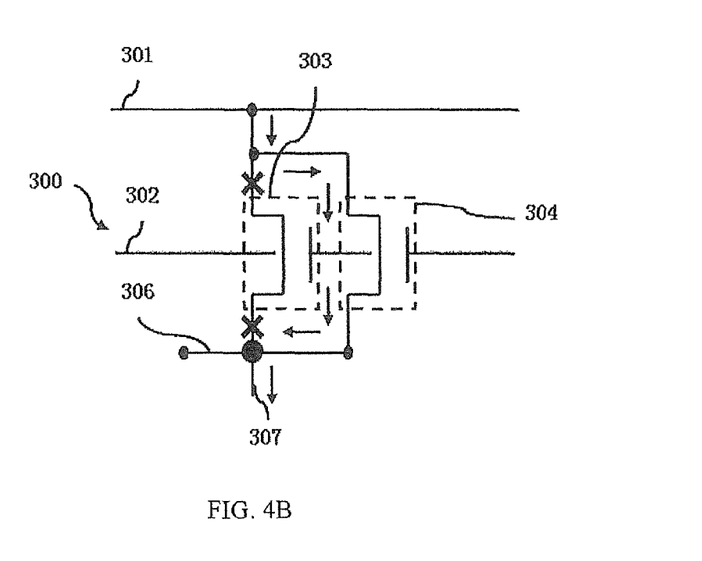
FIG. 4B is a view of the repairing method for the display device in FIG. 4A.

Please referring FIG. 4A and FIG. 4B, FIG. 4A is a view of the display device in the second embodiment of the present invention. FIG. 4B is a view of the repairing method for the display device in FIG. 4A. The present embodiment is similar to the first embodiment and the difference therebetween is illustrated in the following description.

In the present embodiment, the first dummy line 306 includes a first end and a second end. The first end is connected with the second end and the second end is disposed at another side of the testing signal output line 307 opposite the first end.

When the short circuit is occurred in the first TFT 303, the first dummy line 306 is connected with the testing signal output line 307 by the laser welding method.

The testing method of the display device in the present embodiment is required to process two times for laser cutting and one time for laser welding.

Figure 5A:
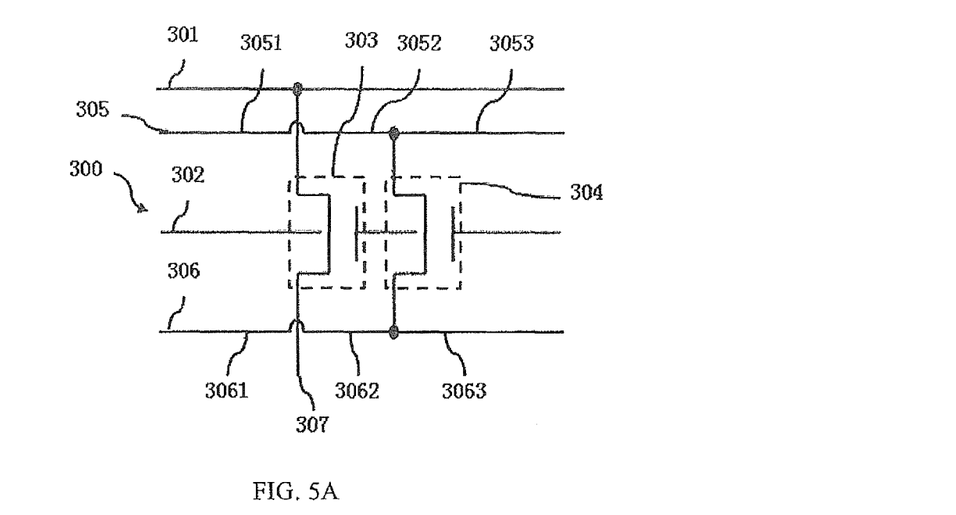
FIG. 5A is a view of the display device in a third embodiment of the present invention.
Figure 5B:
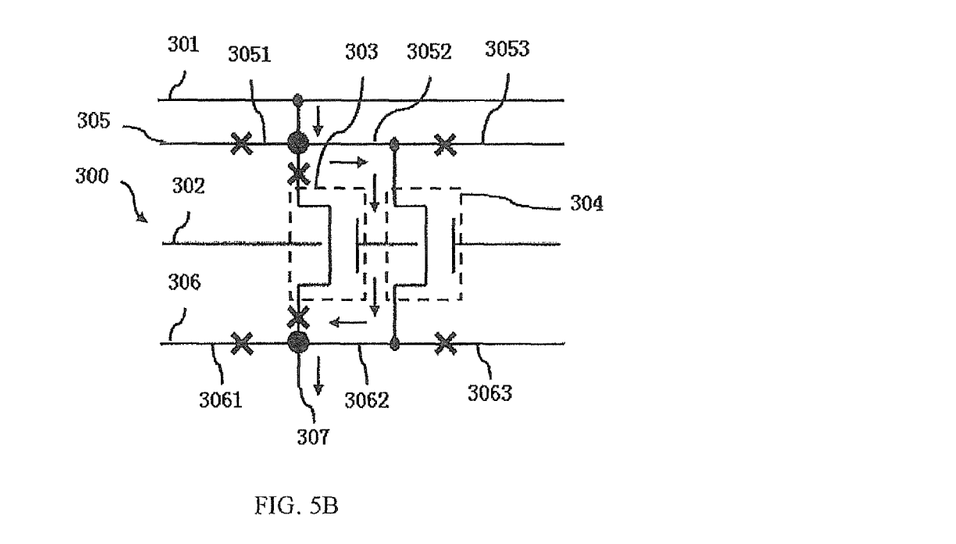
FIG. 5B is a view of the repairing method for the display device in FIG. 5A.

Referring FIG. 5A and FIG. 5B, FIG. 5A is a view of the display device in a third embodiment of the present invention. FIG. 5B is a view of the repairing method for the display device in FIG. 5A. The present embodiment is similar to the first or the second embodiment and the difference therebetween is illustrated in the following description.

In the present embodiment, the display panel 300 further includes at least one second dummy line 305 and the second dummy line 305 includes a fourth section 3051, a fifth section 3052, and a sixth section 3053. The fifth section 3052 is disposed between the fourth section 3051 and the sixth section 3053 and the fifth section 3052 is connected with the second input end.

When the short circuit is occurred in the first TFT 303, the fifth section 3052 is connected with the testing signal input line 301 by the laser welding method and the fifth connection between the fourth section 3051 and the fifth section 3052 is cut off by the laser cutting method. The sixth connection between the sixth section 3053 and the fifth section 3052 is cut off by the laser cutting method.

The repairing method of the display method in the present embodiment is required to process six times for laser cutting and two times for laser welding.

In any one of the aforementioned embodiments (the first embodiment, the second embodiment, or the third embodiment), preferably, the second TFT 304 is the same as the first TFT 303. For example, the size and the properties of the second TFT 304 are the same or mostly similar to the first TFT 303. Therefore, after the aforementioned technical method is used to repair the display device, the resistance of the all lines in the display device won't be varied.

In any one of the aforementioned embodiments, since the second TFT 304 (the backup TFT) is implemented to repair the display device, the width-to-length ratio of the display device will not be changed and the abnormal display won't happen in the light-on testing and error detection won't happen. The malfunction of the lines in the display panel 300 during the curing process is reduced and the yield of the display panel 300 is increased.

Referring FIG. 3A and FIG. 3B, FIG. 3A is a view of the display device in a first embodiment of the present invention. FIG. 3B is a view of the repairing method for the display device in FIG. 3A. The dots "●" in FIG. 3B are the laser welding positions and the crosses "X" in FIG. 3B are the laser cutting positions.

A. The first connection and the second connection are cut off by the laser cutting method. The first connection is between the first input end of the first TFT 303 and the testing signal input line 301 and the second connection is between the first input end of the first TFT 303 and the testing signal output line 307.

B. The first dummy line 306 is connected with the testing signal output line 307 by the laser welding method in the display device. The second input end of the second TFT in the display device is connected with the testing signal input line 301 and the second input end of the second TFT 304 is connected with the first dummy line 306.

In the present embodiment, step B includes:

B1. The second section 3062 of the first dummy line 306 is connected with the testing signal output line 307 by the laser welding method.

In the present embodiment, the method further comprises:

C. A third connection and a fourth connection are cutting off by the laser cutting method. The third connection is between the first section 3061 and the second section 3062 of the first dummy line 306 and the fourth connection is between the third section 3063 and the second section 3062 of the first dummy line 306.

The second output end is connected with the second section 3062 and the second section 3062 is disposed between the first section 3061 and the third section 3063. The second input end of the second TFT 304 is connected with the testing signal input line 301 and the second output end of the second TFT 304 is connected with the first dummy line 306 by the second section 3062. The first output end is a drain or a source of the first TFT 303 when the first input end is the source or the drain of the first TFT 303.

In the present embodiment, when the short circuit has occurred in the first TFT 303, the second controlling end of the second TFT 304 receives the controlling signal from the controlling signal line 302 of the display device and turns on or off the switch corresponding to the second TFT 304 in accordance with the controlling signal.

In the present embodiment, the second TFT 304 is the backup TFT for the first TFT 303 and the second TFT 304 is implemented to repair the display device/display panel 300 when the short circuit is occurred in the first TFT 303.

In the present embodiment, the repairing method of the display device is to cut off the damaged TFT (such as the first TFT 303 with the short circuit) and the testing signal line 301 and the data line/gate line (corresponding to the testing signal output line 307). The testing signal in the testing signal line 301 can transmit to the display area within the display panel from the backup TFT (the second TFT 304). Thereafter, the first dummy is cut off. After repairing, the transmitting path of the testing signal is shown as the arrows in FIG. 3B.

The repairing method of the display device in the present embodiment is required to process four times for laser cutting and one time for laser welding.

In the present embodiment, the executing sequence of the steps is not limited herein. In other words, the aforementioned steps can be executed by any sequence.

Please referring FIG. 4A and FIG. 4B, FIG. 4A and FIG. 4B are views of the display device in the second embodiment of the present invention. The present embodiment is similar to the first embodiment and the difference therebetween is illustrated in the following description.

In the present embodiment, the method further includes:

D. The first dummy line 306 is connected with the testing signal output line 307 by the laser welding method.

The first dummy line 306 includes a first end and a second end, and the first end is connected with the second output end and the second end is disposed at another side of the testing signal output line 307 opposite the first end.

The repairing method of the display device in the present embodiment is required to process two times for laser cutting and one time for laser welding.

In the present embodiment, the executing sequence of the steps is not limited herein. In other words, the aforementioned steps can be executed by any sequence.

Referring FIG. 5A and FIG. 5B, FIG. 5A and FIG. 5B are views of the display device in the third embodiment of the present invention. The present embodiment is similar to the first or the second embodiment and the difference therebetween is illustrated in the following description.

In the present embodiment, the method further includes:

E. A fifth connection and a sixth connection are cut off by the laser cutting method. The fifth connection is between a fourth section 3051 and a fifth section 3052 of a second dummy line 305 and the sixth connection is between a sixth section 3053 and the fifth section 3052 of the second dummy line 305 in the display device.

F. The fifth section 3052 is connected with the testing signal input line 301 by the laser welding method.

The fifth section is between the fourth section and the sixth section and the fifth section is connected with the second input end.

The repairing method of the display device in the present embodiment is required to process six times for laser cutting and two times for laser welding.

In the present embodiment, the executing sequence of the steps is not limited herein. In other words, the aforementioned steps can be executed by any sequence.

In any one of the aforementioned embodiments (the first embodiment, the second embodiment or the third embodiment), preferably, the second TFT 304 is the same as the first TFT 303. For example, the size and the properties of the second TFT 304 are the same or mostly similar to the first TFT 303. Therefore, after the aforementioned technical method is used to repair the display device, the resistance of the all lines in the display device won't be varied.

In any one of the aforementioned embodiments, since the second TFT 304 (the backup TFT) is implemented to repair the display device, the width-to-length ratio of the display device will not be changed and the abnormal display won't happen in the light-on testing and error detection won't happen. The malfunction of the lines in the display panel 300 during the curing process is reduced and the yield of the display panel 300 is increased.

As described above, the present invention has been described with preferred embodiments thereof and it is understood that many changes and modifications to the described embodiments can be carried out without departing from the scope and the spirit of the disclosure that is intended to be limited only by the appended claims.

What is claimed is:

1. A display device, comprising:
    a display panel comprising:
        a first thin film transistor (TFT) array comprising at least one first TFT;
        a second TFT array comprising at least one second TFT; and
        at least one first dummy line,
    wherein the first TFT is adjacent to the second TFT and the second TFT is connected with a testing signal input line and the first dummy line;
    when a short circuit has occurred in the first TFT, a first connection between a first input end of the first TFT and the first dummy line is cut off by a laser cutting method, and a second connection between the first input end of the first TFT and a testing signal output line is cut off by the laser cutting method, the first dummy line is connected with the testing signal output line by a laser welding method;

and the display panel further comprising:
a controlling signal line array comprising at least one controlling signal line; and
a first controlling end of the first TFT is connected with a second controlling end of the second TFT and the controlling signal line, and when the short circuit has occurred in the first TFT, a controlling signal is received in the second controlling end from the controlling signal line;
the first output end is a drain or a source of the first TFT when the first input end is the source or the drain of the first TFT.

2. The display device according to claim 1, wherein the second controlling end is implemented to turn on or off a switch corresponding to the second TFT in accordance with the controlling signal.

3. The display device according to claim 1, wherein a second input end of the second TFT is connected with the testing signal input line and a second output end of the second TFT is connected with the first dummy line.

4. The display device according to claim 1, wherein the first dummy line comprises:
a first section, a second section and a third section; and
the second section is disposed between the first section and the third section and the second section is connected with the second output end;
when the short circuit has occurred in the first TFT, the second section is connected with the testing signal output line by the laser welding method, a third connection between the first section and the third section is cut off by the laser cutting method, and a fourth connection between the third section and the second section is cut off by the laser cutting method.

5. The display device according to claim 1, wherein the first dummy line includes a first end and a second end, and the first end is connected with the second output end and the second end is disposed in another side of the testing signal output line opposite the first end;
when the short circuit has occurred in the first TFT, the first dummy line is connected with the testing signal output line by the laser welding method.

6. The display device according to claim 1, wherein the display device further comprises:
at least one second dummy line including a fourth section, a fifth section and a sixth section;
the fifth section is disposed between the fourth section and the sixth section, and the fifth section is connected with the second input end;
when the short circuit has occurred in the first TFT, the fifth section is connected with the testing signal input line by the laser welding method, a fifth connection between the fourth section and the fifth section is cut off by the laser cutting method, and a sixth connection between the sixth section and the fifth section is cut off by the laser cutting method.

7. A display device, comprising:
a display panel comprising:
a first TFT array comprising at least one first TFT;
a second TFT array comprising at least one second TFT; and
at least one first dummy line,
wherein the first TFT is adjacent to the second TFT, and the second TFT is connected with a testing signal input line and the first dummy line;
when a short circuit has occurred in the first TFT, a first connection between a first input end of the first TFT and the first dummy line is cut off by a laser cutting method and a second connection between the first input end of the first TFT and a testing signal output line is cut off by the laser cutting method, the first dummy line is connected with the testing signal output line by a laser welding method.

8. The display device according to claim 7, wherein the display panel further comprises:
a controlling signal line array comprising at least one controlling signal line; and
a first controlling end of the first TFT is connected with a second controlling end of the second TFT and the controlling signal line, and when the short circuit has occurred in the first TFT, a controlling signal is received in the second controlling end from the controlling signal line.

9. The display device according to claim 8, wherein the second controlling end is implemented to turn on or off a switch corresponding to the second TFT in accordance with the controlling signal.

10. The display device according to claim 8, wherein a second input end of the second TFT is connected with the testing signal input line and a second output end of the second TFT is connected with the first dummy line.

11. The display device according to claim 10, wherein the first dummy line comprises:
a first section, a second section and a third section; and
the second section is disposed between the first section and the third section and the second section is connected with the second output end;
when the short circuit has occurred in the first TFT, the second section is connected with the testing signal output line by the laser welding method, a third connection between the first section and the third section is cut off by the laser cutting method, and a fourth connection between the third section and the second section is cut off by the laser cutting method.

12. The display device according to claim 10, wherein the first dummy line includes a first end and a second end, and the first end is connected with the second output end and the second end is disposed at another side of the testing signal output line opposite the first end;
when the short circuit has occurred in the first TFT, the first dummy line is connected with the testing signal output line by the laser welding method.

13. The display device according to claim 10, wherein the display device further comprises:
at least one second dummy line including a fourth section, a fifth section and a sixth section;
the fifth section is disposed between the fourth section and the sixth section, and the fifth section is connected with the second input end;
when the short circuit has occurred in the first TFT, the fifth section is connected with the testing signal input line by the laser welding method, a fifth connection between the fourth section and the fifth section is cut off by the laser cutting method, and a sixth connection between the sixth section and the fifth section is cut off by the laser cutting method.

14. The display device according to claim 7, wherein the first output end is a drain or a source of the first TFT when the first input end is the source or the drain of the first TFT.

15. A testing line repairing method according to the display device in claim 7, comprising:
A. cutting the first connection and the second connection by the laser cutting method, and the first connection is between the first input end of the first TFT and the testing signal input line, and the second connection is between the first output end of the first TFT and the testing signal output line;

B. connecting the first dummy line with the testing signal output line by the laser welding method in the display device, wherein the second input end of the second TFT in the display device is connected with the testing signal input line, and the second output end of the second TFT is connected with the first dummy line.

16. The testing line repairing method of the display device according to claim 15, wherein the step B comprises:

B1. connecting the second section of the first dummy line with the testing signal output line by the laser welding method;

and the method further comprises:

C. cutting off a third connection and a fourth connection by the laser cutting method, wherein the third connection is between the first section and the second section of the first dummy line and the fourth connection is between the third section and the second section of the first dummy line;

wherein the second output end is connected with the second section and the second section is disposed between the first section and the third section.

17. The testing line repairing method of the display device according to claim 15, wherein the method further comprises:

D. connecting the first dummy line with the testing signal output line by the laser welding method;

wherein the first dummy line includes a first end and a second end, and the first end is connected with the second output end, and the second end is disposed at another side of the testing signal output line opposite the first end.

18. The testing line repairing method of the display device according to claim 15, wherein the method further comprises:

E. cutting off a fifth connection and a sixth connection by the laser cutting method, and the fifth connection is between a fourth section and a fifth section of a second dummy line and the sixth connection is between a sixth section and the fifth section of the second dummy line in the display device;

F. connecting the fifth section with the testing signal input line by the laser welding method;

wherein the fifth section is between the fourth section and the sixth section and the fifth section is connected with the second input end.

19. The testing line repairing method of the display device according to claim 15, wherein the first output end is a drain or a source of the first TFT when the first input end is the source or the drain of the first TFT.

20. The testing line repairing method of the display device according to claim 15, wherein the method further comprises:

G. receiving a controlling signal in the second controlling end of the second TFT from a controlling signal line in the display device to turn on or off a switch corresponding to the second TFT.

* * * * *